(12) United States Patent
Bilak et al.

(10) Patent No.: US 7,088,153 B2
(45) Date of Patent: Aug. 8, 2006

(54) DATA STORAGE LATCH STRUCTURE WITH MICRO-ELECTROMECHANICAL SWITCH

(75) Inventors: Mark R. Bilak, Sandy Hook, CT (US); Thomas J. Fleischman, Poughkeepsie, NY (US)

(73) Assignee: International Business Machines Corporation, Armonk, NY (US)

(*) Notice: Subject to any disclaimer, the term of this patent is extended or adjusted under 35 U.S.C. 154(b) by 120 days.

(21) Appl. No.: 10/912,610

(22) Filed: Aug. 5, 2004

(65) Prior Publication Data
US 2006/0028258 A1 Feb. 9, 2006

(51) Int. Cl.
*H03K 3/037* (2006.01)
*H03K 3/12* (2006.01)
*H03K 3/356* (2006.01)

(52) U.S. Cl. .................... 327/108; 327/218
(58) Field of Classification Search .............. None
See application file for complete search history.

(56) References Cited

U.S. PATENT DOCUMENTS

| | | | | |
|---|---|---|---|---|
| 3,825,772 A * | 7/1974 | Ainsworth | ............... | 327/385 |
| 3,831,164 A * | 8/1974 | Cook | ............... | 340/516 |
| 3,946,254 A * | 3/1976 | Millben | ............... | 327/202 |
| 4,257,082 A * | 3/1981 | Brown | ............... | 361/191 |
| 4,382,285 A * | 5/1983 | Sumner et al. | ............... | 708/301 |
| 4,855,669 A * | 8/1989 | Mahoney | ............... | 324/73.1 |
| 5,578,976 A | 11/1996 | Yao | ............... | 333/262 |
| 5,994,982 A | 11/1999 | Kintis et al. | ............... | 333/235 |
| 6,069,540 A | 5/2000 | Berenz et al. | ............... | 333/101 |
| 6,072,686 A | 6/2000 | Yarbrough | ............... | 361/234 |
| 6,094,971 A | 8/2000 | Edwards et al. | ............... | 73/105 |
| 6,100,477 A | 8/2000 | Randall et al. | ............... | 200/181 |
| 6,127,744 A | 10/2000 | Streeter et al. | ............... | 307/125 |
| 6,144,545 A | 11/2000 | Lee et al. | ............... | 361/233 |
| 6,160,230 A | 12/2000 | McMillan et al. | ............... | 200/181 |
| 6,172,316 B1 | 1/2001 | Jacob | ............... | 200/181 |
| 6,198,438 B1 | 3/2001 | Herd et al. | ............... | 343/700 MS |
| 6,218,911 B1 | 4/2001 | Kong et al. | ............... | 333/101 |
| 6,229,683 B1 | 5/2001 | Goodwin-Johansson | ............... | 361/333 |
| 6,307,169 B1 | 10/2001 | Sun et al. | ............... | 250/181 |
| 6,417,743 B1 | 7/2002 | Mihailovich et al. | ............... | 333/24 C |
| 6,445,195 B1 | 9/2002 | Ward | ............... | 324/684 |
| 6,501,268 B1 | 12/2002 | Edelstein et al. | ............... | 324/244 |
| 6,531,668 B1 | 3/2003 | Ma | ............... | 200/181 |
| 6,583,374 B1 | 6/2003 | Knieser et al. | ............... | 200/181 |
| 6,621,392 B1 | 9/2003 | Volant et al. | ............... | 335/78 |
| 6,635,506 B1 | 10/2003 | Volant et al. | ............... | 438/52 |
| 6,744,338 B1 | 6/2004 | Nikitin | ............... | 333/262 |
| 6,804,552 B1 * | 10/2004 | Thompson et al. | ............... | 607/2 |
| 2002/0075094 A1 | 6/2002 | Bechtle et al. | ............... | 333/105 |
| 2003/0178635 A1 | 9/2003 | Volant et al | ............... | 257/108 |

OTHER PUBLICATIONS

Miron Abramovici, Digital System Testing and Testable Design, IEEE Press, Chapter 9, 1990 © (9.3-9.9).

* cited by examiner

*Primary Examiner*—Tuan T. Lam
(74) *Attorney, Agent, or Firm*—Joseph P. Abate, Esq.; Greenblum & Bernstein, P.L.C.

(57) ABSTRACT

Micro-electromechanical switches (MEMS) are configured to form a data storage latch to reduce power consumption, to reduce the space used in an integrated circuit, and to improve performance of the integrated circuit. MEMS are implemented at the wiring layer connected to an integrated circuit and coupled to form a storage latch.

22 Claims, 6 Drawing Sheets

DATA STORAGE LATCH STRUCTURE WITH MICRO-ELECTROMECHANICAL SWITCH

FIELD OF THE INVENTION

The invention relates to micro-electromechanical switches and, more particularly, to micro-electromechanical switches configured as data storage latches for reducing power consumption, improving integrated circuit performance, and reducing the space used in an integrated circuit.

BACKGROUND OF THE INVENTION

Storage latches, such as a data latch (or "D latch"), are implemented using various circuit layouts. Storage latches can be used to build counting circuitry and storage circuits for numbers. In fact, integrated circuits containing thousands of storage latch components are often used as data-storage (or memory) devices in computers. The value of a latch and associated circuitry output depends on the past history of the inputs as well as the current values of the inputs, thus, the particular sequence of inputs matters.

Some examples of storage latch uses include read-only applications and integrated circuit testing. For example, scan based test methodology for testing faults, DC type testing, and basic testing of shorts may use storage latches. To facilitate this testing methodology, a number of storage latches may be necessary, with some integrated circuits requiring thousands of storage latches.

FIG. 1 illustrates a conventional storage latch design 100. The circuit includes a data input 110, a clock input 120, a flip-flop formed by NAND gates 140 and 160, and enabling gates 130 and 150. It is desirable for the flip-flop to respond to the data input only at certain times and to ignore the data input at all other times, thus the inclusion of enabling gates 130 and 150. Enabling gate 130 passes D and enabling gate 150 passes D(NOT) (i.e. inverted version of D) to the inputs of the flip-flop only when the clock input (i.e. enabling input) is active (i.e. a logic one).

The D input is sampled during the occurrence of a clock pulse. If it is a logic 1, the output Q 170 of the flip-flop is set to a logic 1 (if D is a logic 1, then the output of enabling NAND gate 130 is a logic 0, the output of enabling NAND gate 150 is a logic 1, the output Q 170 of NAND gate 140 is a logic 1 and the output Q(NOT) 180 of NAND gate 160 is a logic 0). If D is a logic 0, the output Q 170 of the flip-flop is set to 0. When the clock input 120 is not active, the flip-flop remains in its previous state (i.e. either a logic 1 or logic 0) indefinitely because of the cross-couple nature of the flip-flop device, thus forming a memory element. Thus, a binary digit can be stored in the D latch and the device can be used as a memory element. The memory element can be set to a logic 1 or reset to a logic 0 by appropriate pulses on the input and clock lines. To store an n-bit binary number would require n flip-flops.

Data storage circuits, such as that described in FIG. 1, may be used for testing within a more complex integrated circuit. Data storage latches may be arranged together, such as in parallel, so that one latch feeds into another latch. During one clock event, data can be captured in the first latch. During a second clock event, the data may be transferred to the next latch. This can be continued for as many latches that exist in the integrated circuit.

During the testing of an integrated circuit, test patterns are loaded into latches, typically one bit at a time. The test patterns are clocked through the latches and excite the appropriate circuitry, thereby facilitating excitation and observation of an integrated circuit (IC).

Conventional data latches are implemented using standard circuit methodologies such as CMOS transistor-based logic blocks such as NAND gates, AND gates, invertors, and the like. However, such implementation may involve thousands of latches, and potentially hundreds of thousands of transistors. Thus, conventional data storage latches take up a lot of room in an integrated circuit (i.e. silicon area), as well as use up large amounts of power and hinder performance.

As the size of a transistor is reduced, sub-threshold leakage may increase. Even when the transistor is inactive and not switching, there may still be an amount of leakage current from the source of the transistor to its drain. The amount of leakage becomes noticeable based on the thousands of potential latches that may be used. For example, in CMOS, this is due to the nature of CMOS circuit design, and processes. Thus, each latch used in an IC adds to the total dynamic and static power consumption of the IC. This power consumption becomes nontrivial as transistor sizes continue to decrease and the number of latches incorporated in ICs increase.

Transistors also include an inherent delay associated with the transmission of signals due to a number of parasitic capacitances inherent in transistor devices. Transistors in conventional data latches may cause an additional delay within the integrated circuit to which the data latches are attached. This additional delay may adversely impact the overall performance of the integrated circuit. In particular, at high speeds, such as is the gigahertz range, the transistor delay may begin to significantly deteriorate the tolerance of the design.

FIG. 2 illustrates a micro-electromechanical switch (also referred to as a MEMS or as a MEMs switch). An exemplary double-pole MEMs switch 200 is integrated into standard CMOS processes. The first pole 210 is activated by first control electrode 220 and the second pole 230 is activated by second control electrode 240. It would be desirable to replace conventional transistor-based data latches with MEMs-based data latches. Since MEMs switches are fabricated in the metal wiring layers of an integrated circuit and exhibit more ideal switch characteristics (extremely low leakage), a MEMs-based data latch would consume no silicon in an integrated circuit, would eliminate power consumption associated with transistor-based latches and would improve performance by eliminating the inherent delay associated with conventional CMOS transistors.

SUMMARY OF THE INVENTION

According to an exemplary embodiment of the invention, a circuit includes a data signal input, a clock signal input and a plurality of micro-electromechanical switches configured to form a latch, wherein the data signal input is coupled to at least one of the plurality of micro-electromechanical switches and the clock signal input is coupled to at least one of the plurality of micro-electromechanical switches.

According to another exemplary embodiment of the invention, a circuit includes an integrated circuit device, a data signal input, a clock signal input and a plurality of micro-electromechanical switches configured to form at least one latch, wherein the plurality of micro-electromechanical switches are fabricated in a wiring connected to the integrated circuit device, the data signal input and the integrated circuit device are coupled to the at least one latch, and the clock signal input is coupled to at least one of the plurality of micro-electromechanical switches.

An additional exemplary embodiment of the invention provides a method for storing data in a latch including the steps of inputting data into a gating micro-electromechanical switch, inputting a clock signal into the gating micro-electromechanical switch, and closing the gating micro-electromechanical switch based on the clock signal to transmit the data into at least a first data micro-electromechanical switch and a second data micro-electromechanical switch, wherein the first data micro-electromechanical switch and the second data micro-electromechanical switch form a flip-flop.

DETAILED DESCRIPTION OF EMBODIMENTS OF THE INVENTION

The invention is directed to, for example, the use of micro-electromechanical switch-based latch designs. Micro-electromechanical switches ("MEMS") are configured as a data storage latch to reduce power consumption, to reduce the space used in an integrated circuit, and to improve performance of an integrated circuit. MEMS consume virtually no power and are compatible with typical semiconductor processes. Thus, power draw and signal delay may be reduced or eliminated without adversely impacting the design process. Additionally, MEMS are fabricated in the wiring levels of semiconductor devices, thus consuming no silicon area. Therefore, the overall size of an integrated circuit can be reduced and/or can be maintained while providing for additional circuit components by using MEMs-based latches.

Figure 3:
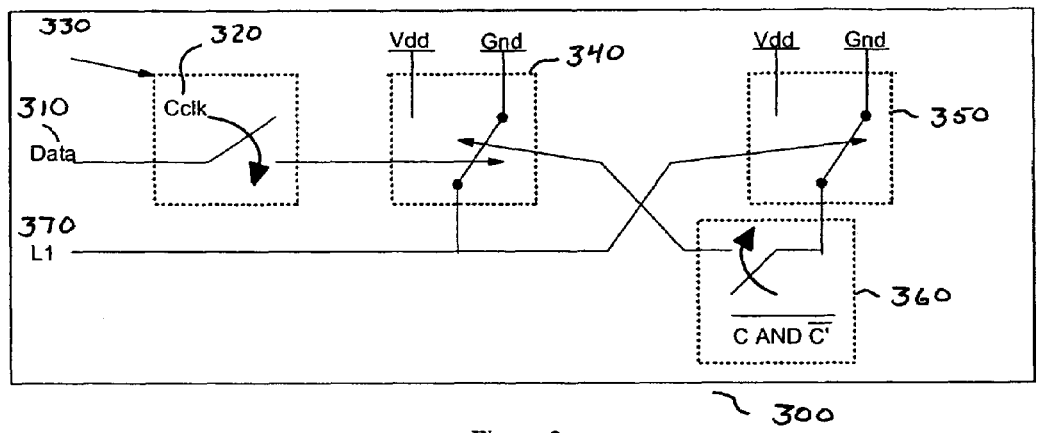
FIG. 3 illustrates a data storage latch design using micro-electromechanical switches according to an embodiment of the invention.

FIG. 3 illustrates a storage latch design using MEMS according to an embodiment of the invention. According to an embodiment of the invention, a single MEMS data latch circuit 300 is constructed with a data input 310, a clock input 320 and four MEMS, 330, 340, 350, 360 as shown in FIG. 3. More particularly, the MEMS data latch has a gating MEMS 330 (also called a gating switch), a MEMs-based flip-flop formed by first data MEMS 340 (also called a first data switch) and second data MEMS 350 (also called a second data switch), and coupling MEMS 360 (also called a coupling switch). The MEMs switches may be single throw, double pole or multiple pole, multiple throw. Alternatively, the double pole switches may be constructed from two single pole switches.

Clock input 320 controls gating switch 330, so that the switch is closed when the clock input 320 is high, or active, and the switch is open when the clock input 320 is low or not active. Gating switch 330 may perform the gating operation of traditional CMOS-based gating logic. When the gating switch 330 is closed, data from data input 310 can set the state of first data switch 340. When gating switch 330 is open, the data has no effect on first data switch 340. Gating switch 330 is activated by the system clock signal 320 and gates the data signal.

When the data from data input 310 flows into first data switch 340, the switch selects either VDD or ground. If the data is active (i.e., the data signal is a 1), the first data switch 340 is thrown to VDD. However, if the data is not active (i.e., the data signal is a 0), the first data switch 340 is thrown to ground. Thus, the first data switch 340 is set to the value of data input 310. Further, the output L1 370 connected to first data switch 340 is set to the value of the data input 310.

Cross-coupling between first data switch 340 and second data switch 350 forms the storage element (i.e. flip-flop). Output L1 370 also connects with second data switch 350, so second data switch 350 is set to the same value as first data switch 340. Thus, if first data switch 340 is at VDD (or ground), second data switch 350 is at VDD (or ground). Coupling switch 360 completes the cross-coupling between first data switch 340 and second data switch 350 when the clock signal C and $\overline{C}$' is active. Data is latched in first data switch 340 and second data switch 350 with little or no power consumption.

Gating switch 330 is opened by de-activating the clock signal 320 and data input 310 no longer has an influence on data switch 340. If data switch 340 is at ground, then second data switch 350 is feed with ground. Second data switch 350 feeds first data switch 340 with ground because coupling switch 360 is closed.

According to an embodiment of the invention, coupling switch 360 is provided to minimize contention between latch 340 and data input 310 when gating switch 330 first closes in response to clock signal Cclk. Coupling switch 360 opens up when gating switch 330 first closes to minimize the contention and reduce or eliminate a power drain. Thus, data discharges from first data switch 340, allowing first data switch 340 to come to a steady state. Coupling switch 360 remains open for some amount of time after gating switch 330 closes to allow first data latch 340 to stabilize in response to data input 310. After enough time has passed for stabilization to occur, yet while gating switch 320 is still closed, coupling latch 360 also closes, thus completing the latching process. At this point, the first data switch 340 has stabilized to the value of data input 310, which is now latched in the flip-flop formed by first and second data latches 340 and 350, respectively.

Figure 1:
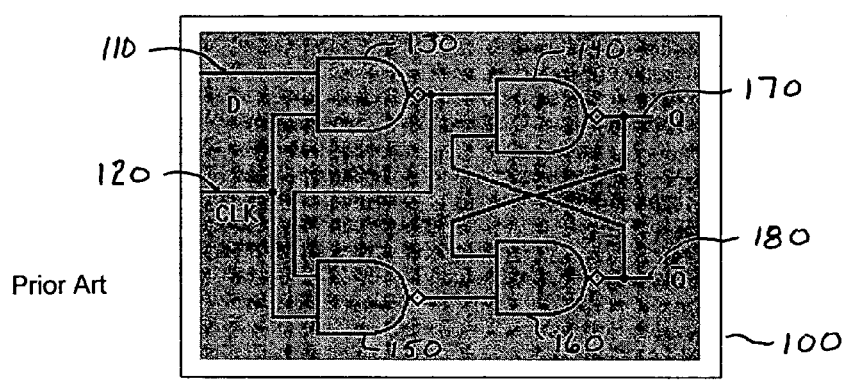
FIG. 1 illustrates a conventional storage latch design.
Figure 2:
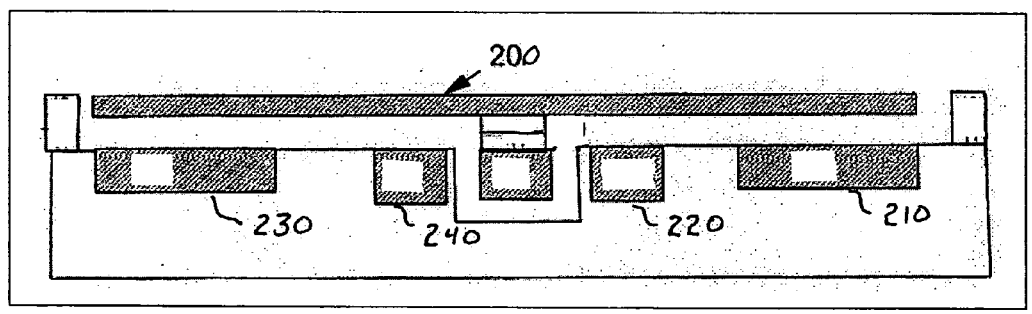
FIG. 2 illustrates a related micro-electromechanical switch.
Figure 4:
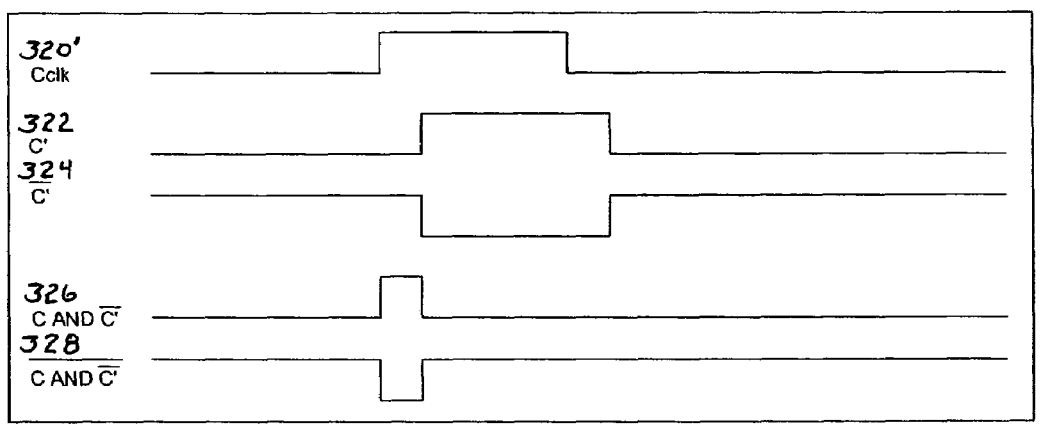
FIG. 4 illustrates a timing diagram according to an embodiment of the invention.

FIG. 4 illustrates a timing diagram according to an embodiment of the invention. As shown with respect to the timing diagram in FIG. 4, coupling switch 360 is closed when signal C and $\overline{C}$' 328 is set to high. Signal C and $\overline{C}$' 328 results from first combining signal C' 322 (a delayed version of Cclk signal 320') and signal $\overline{C}$' 324 (an inverted version of signal C' 322) to form signal C and $\overline{C}$' 326. Signal C and $\overline{C}$' 326 is then inverted to get signal C and $\overline{C}$' 328. The signal C and $\overline{C}$' 328 controls the coupling switch 360 of FIG. 1 as previously described so that contention between data input 310 and first data latch 340 of FIG. 1 is minimized when gating latch 330 of FIG. 1 first closes in response to Cclk signal 320'.

According to an embodiment of the invention, the MEMS storage latch may replace, or supplement, standard data latches used in applications, such as storage applications, read only applications and testing where the frequency capabilities of the MEMS device meets the performance requirements of the application. This reduces chip size and power consumption.

Figure 5:
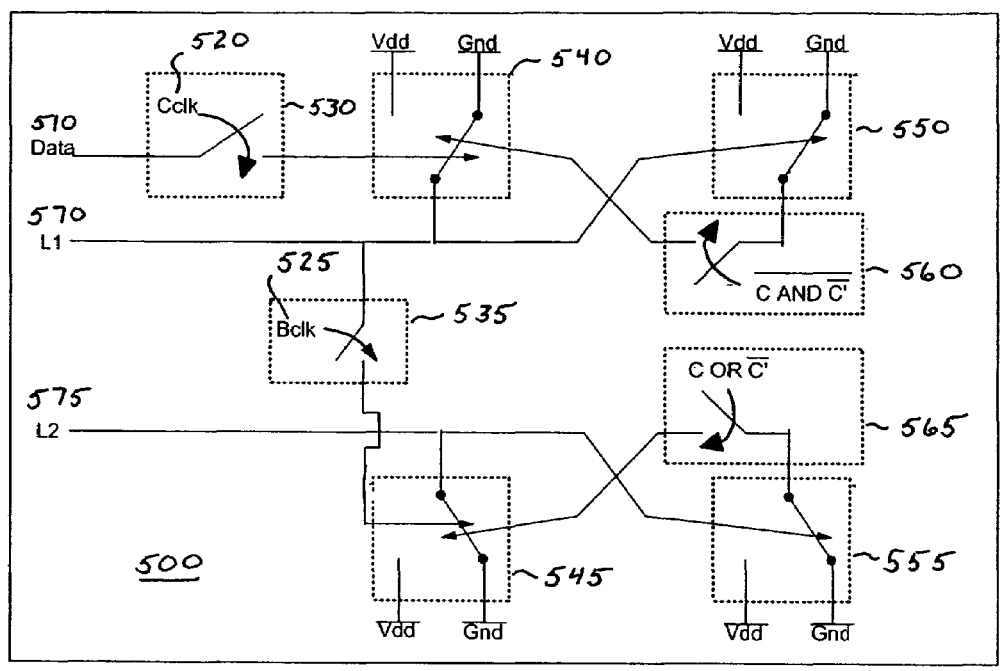
FIG. 5 illustrates a double data storage latch design using micro-electromechanical switches according to an embodiment of the invention.

FIG. 5 illustrates another storage latch design using micro-electromechanical switches according to an embodiment of the invention. More specifically, FIG. 5 illustrates a double MEMS data latch circuit 500 which uses eight MEMS switches. More particularly, the first MEMS data latch has a first gating MEMS 530 (also called a first gating switch), a first MEMs-based flip-flop formed by first data MEMS 540 (also called a first data switch) and a second data MEMS 550 (also called a second data switch) and a first coupling MEMS 560 (also called a first coupling switch). The MEMs switches may be single throw, double pole or multiple pole, multiple throw. Alternatively, the double pole switches may be constructed from two single pole switches.

First clock input 520 controls gating switch 530, so that the switch is closed when the clock input 520 is high, or active, and the switch is open when the clock input 520 is low or not active. Gating MEMS 530 may perform the gating operation of the traditional CMOS-based gating logic. When the gating switch 530 is closed, data from data input 510 can set the state of first data switch 540. When gating switch 530 is open, the data has no effect on first data switch 540. Gating switch 530 is activated by the first clock signal 520 and gates the data signal.

When the data from data input 510 flows into first data switch 540, the switch selects either VDD or ground. If the data is active (i.e., the data signal is a logic 1), the first data switch 540 is thrown to VDD. However, if the data is not active (i.e., the data signal is a logic 0), the first data switch 540 is thrown to ground. Thus, the first data switch 540 is set to the value of data input 510. Further, the output L1 570 connected to first data switch 540 is set to the value of the data input 510.

Cross-coupling between first data switch 540 and second data switch 550 forms the first latch storage element (i.e. first flip-flop). Output L1 570 also connects with second data switch 550, so second data switch 550 is set to the same value as first data switch 540. Thus, if first data switch 540 is at VDD (or ground), second data switch 550 is at VDD (or ground). Coupling switch 560 completes the cross-coupling between first data switch 540 and second data switch 550 when the clock signal C and $\overline{C}$' is active. Data is latched in first data switch 540 and second data switch 550 with little or no power consumption.

Gating switch 530 is opened by de-activating the first clock signal 520, and thus data input 510 no longer has an influence on data switch 540. If data switch 540 is at ground, then second data switch 550 is feed with ground. Second data switch 550 feeds first data switch 540 with ground because coupling switch 560 is closed.

According to an embodiment of the invention, coupling switch 560 is provided to minimize contention between latch 540 and data input 510 when gating switch 530 first closes in response to first clock signal 520. Coupling switch 560 opens up when gating switch 530 first closes to minimize the contention and reduce or eliminate a power drain. Thus, data discharges from first data switch 540, allowing first data switch 540 to come to a steady state. Coupling switch 560 remains open for some amount of time after gating switch 530 closes to allow first data latch 540 to stabilize in response to data input 510. After enough time has passed for stabilization to occur, yet while gating switch 530 is still closed, coupling latch 560 also closes, thus completing the latching process. At this point, the first data switch 540 has stabilized to the value of data input 510, which is now latched in the first flip-flop formed by first and second data latches 540 and 550, respectively.

The second latch (formed by a second gating MEMS 535, a second MEMs-based flip-flop formed by third data MEMS 545 and a fourth data MEMS 555, and second coupling MEMS 565) functions identically to the first latch, with the second clock signal 525 acting in the second latch as the first clock signal 520 acts in the first latch. According to an embodiment of the invention, the first clock signal 520 and the second clock signal 525 must not overlap during normal operation, as is the case in standard double latch design. During a "flush" test operation, where the speed of the double latch is determined, both clocks may be active at the same time, thus "flushing" data through both storage latches.

The double MEMS data latch circuit 500 allows data to be scanned in at one point in time and have that data show up at first output, L1 570. At another point in time, a different data value may be input at data input 510. This different data value shows up in first output, L1 570, while the previous data value is at second output, L2 575. This permits data to be scanned down from one latch to another latch.

Figure 7:
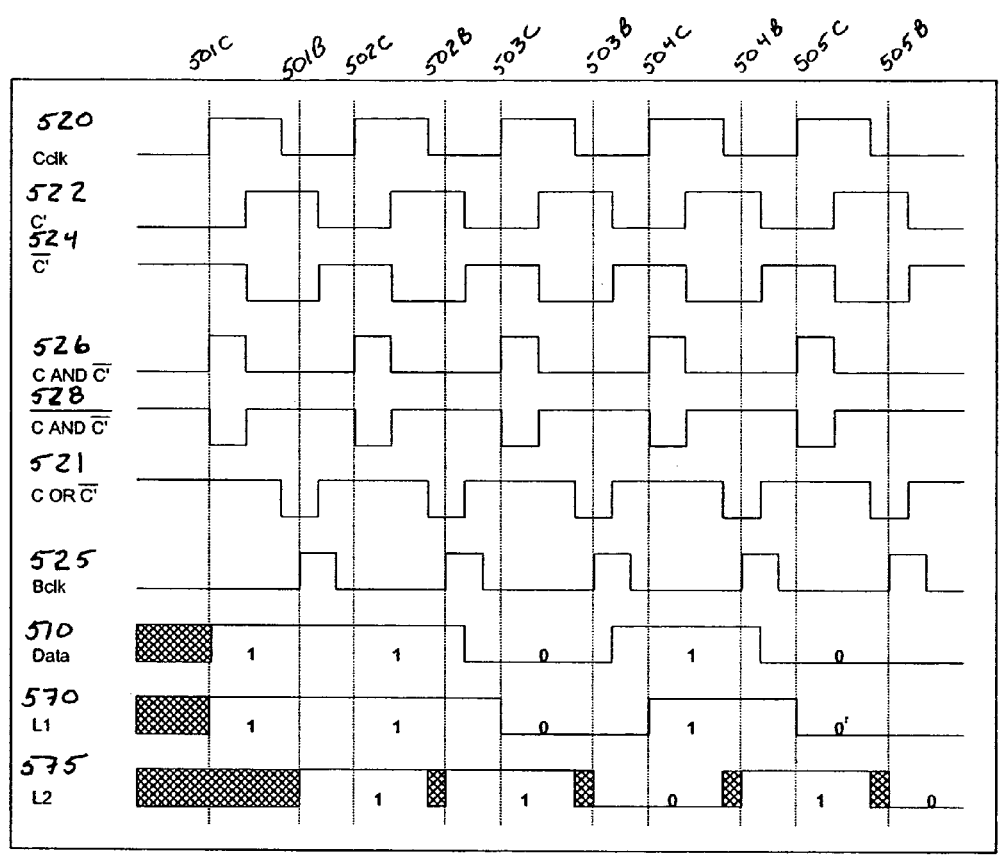
FIG. 7 illustrates a timing diagram for multiple clock cycles according to an embodiment of the invention.

According to an embodiment of the invention, any number of latches may be arranged in this manner to permit data to be scanned down, or to waterfall, to the next latch. This allows large amounts of data to be stored, if desired. Such a structure may be used in a test application, where each output line is connected to a separate section of an integrated circuit. The data may be used to test the integrated circuit logic by submitting a data value to each of the portions of the integrated circuit without losing the state of the previous data value. FIG. 7 illustrates multiple clock cycles that cause data to move through the latches.

Figure 6:
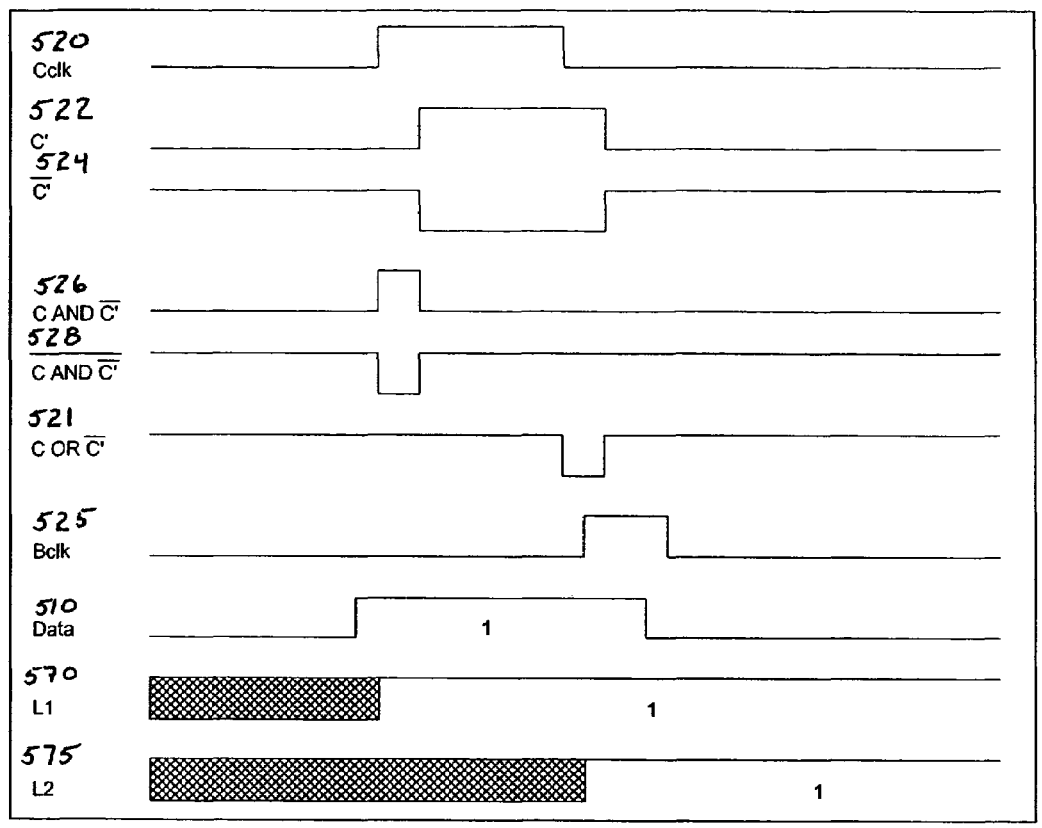
FIG. 6 illustrates a timing diagram for one clock cycle according to an embodiment of the invention.

FIG. 6 illustrates a timing diagram for one clock cycle used with the storage latch of FIG. 5 according to an embodiment of the invention. FIGS. 6 and 7 are similar to FIG. 4, in that both indicate the timing for switching the various MEMS in the double MEMS data latch circuit 500.

For example, as shown with respect to the timing diagram in FIG. 6, first gating switch 560 is closed when signal C and $\overline{C}$' 528 is set to high. Signal C and $\overline{C}$' 528 results from first combining signal C' 522 and signal $\overline{C}$' 524 to form signal C and $\overline{C}$' 526, and then taking the inverse of signal $\overline{C}$' 526 to obtain signal $\overline{CandC}$' 528. Further, signal C' 522 and signal $\overline{C}$' 524 may be combined to form signal C or $\overline{C}$' 521. Bclock 525 and Data 510 are also illustrated with respect to the other signals, with Data 510 showing a 1 or active signal. Thus, output L1 570 has a 1 or active signal when Cclk 520 transitions to active, and output L2 575 has a 1 or active signal when Bclk 525 transitions to active.

FIG. 7 illustrates a timing diagram for multiple clock cycles used with the storage latch of FIG. 5 according to an embodiment of the invention. The timing signals are substantially identical to those illustrated in FIG. 6; however, FIG. 7 illustrates these timing signals over multiple clock cycles to illustrate multiple data values passing through the double data latch illustrated in FIG. 5. Transitions from low to high for Cclock input 520 and Bclock input 525 are identified for each clock, where transitions 501C, 502C, 503C, 504C and 505C are transitions from low to high for Cclock input 520, and transitions 501B, 502B, 503B, 504B and 505B are transitions from low to high for Bclock input 525.

At transition 501C, a first data value is transmitted from data input 510 to the first flip-flop formed by first data switch 540 and second data switch 550 through gating switch 530, and thus, output L1 570 reflects the first value of data input 510. Also at transition 501C, first coupling switch 560 is opened in response to signal C and $\overline{C}$, which remains deactive for some amount of time just after transition 501C, thus minimizing contention between first data switch 540 and data input 510 as previously described. Signal C and $\overline{C}$ goes active shortly after transition 501C occurs, thus latching the first value of data input 510 in the first flip-flop.

At transition 501B, output L1 570 is transmitted to the second flip-flop formed by third data switch 545 and fourth data switch 555 through gating switch 535, and thus, output L2 575 also reflects the first value of data input 510. Just before transition 501B, second coupling switch 560 is opened in response to signal C or $\overline{C}$' 521, which is deactive for some amount just before and just after transition 501B, thus minimizing contention between second data switch 545 and output L1 570 as previously described. Signal C or $\overline{C}$' 521 goes active shortly after transition 501B occurs, thus latching the value of output L1 570, which represents the first value of data input 510, in the second flip-flop.

At transition 502C, a second data value is transmitted from data input 510 to the first flip-flop, and output L1 570 reflects the second value. Also at transition 502C, first coupling switch 560 is again opened in response to C and $\overline{C}$, which is deactive for some amount of time after transition 501C, thus minimizing contention. Signal C and $\overline{C}$ again goes active shortly after transition 501C occurs, thus latching the second value of data input 510 in the first flip-flop. At this point in time, the first value of data input 510 has been latched in the second latch and the second value of data input 510 has been latched in the first latch. The second latch is not affected by transition 502C, and thus, remains undisturbed while the first latch is loaded with the second data value during transition 502C.

At transition 502B, output L1 570 is transmitted to the second flip-flop, and thus, output L2 575 also reflects the second value of data input 510. Just before transition 501B, second coupling switch 560 is opened in response to signal C or $\overline{C}$' 521, which is deactive for some amount just before and just after transition 501B, thus minimizing contention. Signal C or $\overline{C}$' 521 goes active shortly after transition 501B occurs, thus latching the value of output L1 570, which represents the second value of data input 510, in the second flip-flop.

This process is repeated, for example at 503C through 505B, until all data has been loaded into the data latches as previously described. Thus, the data from data input line 510 is transmitted via the switching through both storage latches. As is illustrated in FIG. 7, after any positive transition of Cclk 520 (e.g. 501C, 502C, etc.) output L1 reflects the current value of data input 510 while output L2 reflects the previous value of data input 510.

Figure 8:
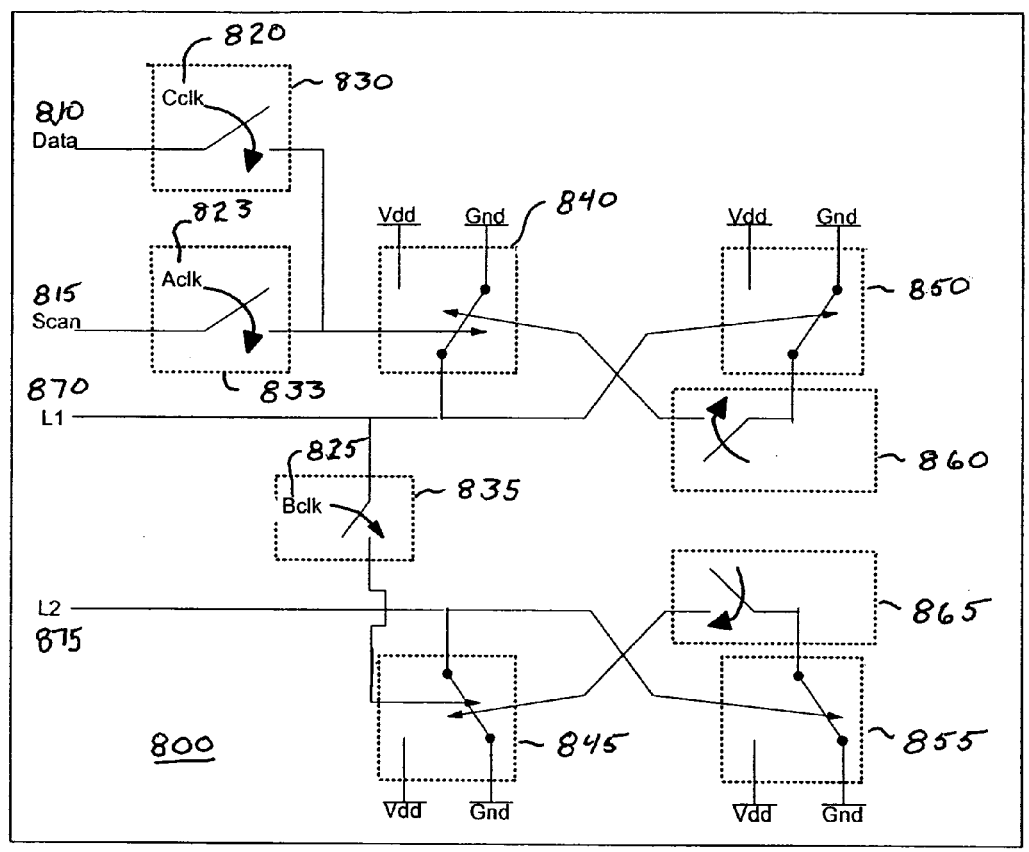
FIG. 8 illustrates a LSSD storage latch design using micro-electromechanical switches according to an embodiment of the invention.

FIG. 8 illustrates another storage latch design using micro-electromechanical switches according to an embodiment of the invention. A MEMS test latch circuit 800 is constructed using nine MEMs switches. For example, first gating switch 830, scan switch 833, first data switch 840, second data switch 850, and first coupling switch 860 form the first latch, and second gating switch 835, third data switch 845, fourth data switch 855 and second coupling switch 865 form the second latch.

The MEMS test latch circuit 800 is configured and functions substantially identically to the double MEMS data latch circuit 500 illustrated in FIG. 5, except that scan switch 833 is included in this embodiment. During normal operation, clock signal Aclk 823 is held low (i.e. deactive) and data is loaded into the double latch from the data input 810 as previously described in accordance with FIGS. 5–7. The MEMS test latch circuit 800 may also be operated in a test mode by holding clock signal Cclk 820 low (i.e. deactive) and activating the Aclock input 823. Test data is loaded into the double data latch as previously described in accordance with FIGS. 5–7 except that the test data is input from the Scan signal 815 through scan switch 833. Also, connecting several MEMS test latch circuits 800 in serial provides a MEMs-based test scan chain. Scan input 815 permits testing, where scan is a term in the industry for testing logic gates.

According to an embodiment of the invention, during normal operations, the data comes in from data input 810 through first gating switch 830 to first data switch 840. During testing, data comes in from scan input 815 through scan switch 833, which is coupled to first data switch 840. Thus, the clock signals Aclk 823 and Cclk 820 must be nonoverlapping such that they are never on or active at the same time. During normal operation, Aclk 823 is deactivated and Cclk 820 is active, thus forming a multiplexer for selecting between test mode and functional operation. This arrangement may eliminate any problems associated with the clock domains.

Data from either data input 810 or scan input 815, as appropriate, is then switched through to output L1 870, via first data switch 840 and second data switch 850 in a manner substantially similar to that described above in FIG. 5. Further, data from output L1 870 is switched through second gating switch 835 using Bclock input 825 to third data switch 845. Thus, the data from output L1 870 is switched through to output L2 875, via third data switch 845 and fourth data switch 855 in a manner substantially similar to that described above in FIG. 5.

As should be understood in view of the above description, according to an embodiment of the invention, the use of MEMS in integrated circuit designs does not require changes to the structure and process for designing and testing integrated circuits. Also, according to an embodiment of the invention, the use of MEMS eliminates, or supplements, the use of conventional data storage latches. Further, the MEMS can be fabricated using standard CMOS processes, as is well known in the industry such as that described, for example, in U.S. Publication No. 2003/0178635 by Volant et al., assigned to IBM, the contents of which are incorporated by reference in their entirety. MEMS may be fabricated using other processes as well. Using MEMS, in the manner described above, also reduces the number of transistors used in an integrated circuit, as the MEMS latches are built on the wiring connected to the integrated circuit. Also, due to the number of existing layers of metal that already exist in many integrated circuits, MEMS may be built into the metal wiring without impacting the size of the device since MEMS do not consume silicon area.

Additionally, the use of MEMS in accordance with the invention may reduce or substantially eliminate power drain associated with conventional storage latches, as a MEM switch is either on or off. Clock domain control, as previously described, may also be performed to avoid switching power consumption found in a conventional latch designs. Transistor switches, such as a conventional CMOS device, have a power draw associated with switching the device; however, the use of MEMS may reduce or eliminate that power draw.

According to an embodiment of the invention, MEMs switches also reduce propagation delay associated with conventional storage latches since MEMS, which are in the metal wiring layer, have a relatively negligible delay as compared with the propagation delay associated with a conventional transistor (i.e. due to parasitic capacitances). This reduction in delay may increase the overall speed associated with the integrated circuit incorporating the MEMs switches. The reduction in delay will be based, at least in part, on the number of MEMs switches used in place of transistor switches and the layout of the integrated circuit.

While the invention has been described in terms of exemplary embodiments, those skilled in the art will recognize that the invention can be practiced with modifications and in the spirit and scope of the appended claims.

What is claimed is:

1. A circuit comprising:
a data signal input;
a clock signal input; and
a plurality of micro-electromechanical switches configured to form a latch;
wherein the data signal input is coupled to at least one of the plurality of micro-electromechanical switches and the clock signal input is coupled to at least one of the plurality of micro-electromechanical switches.

2. The circuit of claim 1, wherein the plurality of micro-electromechanical switches are fabricated in a wiring.

3. The circuit of claim 1, further comprising a semiconductor device coupled to an output signal line of the latch.

4. A circuit comprising:
an integrated circuit device;
a data signal input;
a clock signal input; and
a plurality of micro-electromechanical switches configured to form at least one latch;
wherein the plurality of micro-electromechanical switches are fabricated in a wiring connected to the integrated circuit device, the data signal input and the integrated circuit device are coupled to the at least one latch, and the clock signal input is coupled to at least one of the plurality of micro-electromechanical switches.

5. The circuit according to claim 4, wherein the plurality of micro-electromechanical switches are configured as a first latch and a second latch.

6. The circuit according to claim 5, wherein an output of the first latch is input into the second latch.

7. The circuit according to claim 5, wherein:
a micro-electromechanical switch in the first latch is connected to the clock signal input; and
a micro-electromechanical switch in the second latch is connected to a second clock signal input.

8. The circuit according to claim 4, wherein:
the plurality of micro-electromechanical switches are configured as a plurality of latches, and
the output of all but one of the plurality of latches is input into another one of the plurality of latches.

9. The circuit according to claim 4, further comprising:
a scan signal input; and
a scan clock signal input,
wherein one of the plurality of micro-electromechanical switches is coupled to the scan signal input and the scan clock signal input.

10. The data storage latch according to claim 9, wherein the one of the plurality of micro-electromechanical switches is controlled by the scan clock signal input and receives scan data from the scan signal input.

11. The data storage latch according to claim 10, wherein: the scan clock signal input is not active when the clock signal input is active.

12. The data storage latch according to claim 4, wherein the plurality of micro-electromechanical switches include:
a gating micro-electromechanical switch coupled to the data signal input and the clock signal input;
a first data micro-electromechanical switch coupled to the gating micro-electromechanical switch and to an output signal;
a second data micro-electromechanical switch coupled to the output signal; and
a coupling micro-electromechanical switch coupled to the second data micro-electromechanical switch and coupled to the first data micro-electromechanical switch.

13. The circuit according to claim 12, wherein the coupling micro-electromechanical switch is coupled to the first data micro-electromechanical switch such that the first data micro-electromechanical switch is coupled to the second data micro-electromechanical switch when the coupling micro-electromechanical switch is closed.

14. The circuit according to claim 12, wherein the first data micro-electromechanical switch receives a data signal from the gating micro-electromechanical switch when the clock signal is active.

15. The circuit according to claim 12, wherein the second data micro-electromechanical switch is coupled to the first data micro-electromechanical switch through the output signal line such that the second data micro-electromechanical switch and the first data micro-electromechanical switch form a flip-flop.

16. The circuit according to claim 12, further comprising:
a scan signal input;
a scan clock signal input; and
a scan micro-electromechanical switch which is controlled by the scan clock signal input and receives scan data from the scan signal input.

17. The circuit according to claim 12, further comprising:
a second clock signal input;
a second gating micro-electromechanical switch coupled to the output signal and the second clock signal input;
a third data micro-electromechanical switch coupled to the second gating micro-electromechanical switch and to a second output signal;
a fourth data micro-electromechanical switch coupled to the second output signal; and
a second coupling micro-electromechanical switch coupled to the fourth data micro-electromechanical switch and coupled to the third data micro-electromechanical switch.

18. A method for storing data in a latch comprising the steps of:
inputting data into a gating micro-electromechanical switch;
inputting a clock signal into the gating micro-electromechanical switch; and
closing the gating micro-electromechanical switch based on the clock signal to transmit the data into at least a first data micro-electromechanical switch and a second data micro-electromechanical switch;
wherein the first data micro-electromechanical switch and the second data micro-electromechanical switch form a flip-flop.

19. The method according to claim 18, further comprising the step of transmitting the data signal from the flip-flop to a semiconductor device.

20. The method according to claim 18, further comprising the step of transmitting the data signal from the flip-flop to a second flip-flop, where the second flip-flop includes a third data micro-electromechanical switch and a fourth data micro-electromechanical switch.

21. The method according to claim 18, further comprising the steps of:
- transmitting the data from the flip-flop to a second gating micro-electromechanical switch;
- inputting a second clock signal into the second gating micro-electromechanical switch; and
- closing the second gating micro-electromechanical switch based on the second clock signal to transmit the data into at least a third data micro-electromechanical switch and a fourth data micro-electromechanical switch;
- wherein the third data micro-electromechanical switch and the fourth data micro-electromechanical switch form a flip-flop.

22. The method according to claim 18, further comprising the step of:
- closing a coupling micro-electromechanical switch to reset the first data micro-electromechanical switch and the second data micro-electromechanical switch.

* * * * *